United States Patent
Ikeda et al.

(10) Patent No.: US 6,949,828 B2
(45) Date of Patent: Sep. 27, 2005

(54) WIRING STRUCTURE HAVING INTEGRAL WIRING PORTION AND PLUG PORTION AND METHOD OF FORMING THE SAME

(75) Inventors: Masanobu Ikeda, Kawasaki (JP); Takashi Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/374,524

(22) Filed: Feb. 27, 2003

(65) Prior Publication Data

US 2003/0178727 A1 Sep. 25, 2003

(30) Foreign Application Priority Data

Feb. 27, 2002 (JP) ........................................ 2002-051928

(51) Int. Cl.[7] .................. H01L 29/73; H01L 29/40; H01L 23/48; H01L 23/52
(52) U.S. Cl. .................. 257/758; 257/774; 257/178
(58) Field of Search .................. 257/178, 758, 257/774, 744, 759, 762, 750

(56) References Cited

U.S. PATENT DOCUMENTS

2002/0011672 A1 * 1/2002 Oku et al. ................ 257/758
2003/0173671 A1 * 9/2003 Hironaga et al. .......... 257/758
2004/0198034 A1 * 10/2004 Chuang ...................... 438/622

FOREIGN PATENT DOCUMENTS

JP 2001-298084 A 10/2001

OTHER PUBLICATIONS

Kudo et al., "Copper Dual Damascene Interconnects with Very Low-k Dielectrics Targeting for 130 nm Node," IEEE, 2000, pp. 270–272.

Kitamura et al., "Numerical Simulation of Stress–Induced Failure in Aluminum Conductors of a Microelectronic Package based on Surface and Grain Boundary Diffusion," Conference Papers, 1993, pp. 51–56.

* cited by examiner

*Primary Examiner*—Nathan J. Flynn
*Assistant Examiner*—Victor A. Mandala, Jr.
(74) *Attorney, Agent, or Firm*—Westerman, Hattori, Daniels & Adrian, LLP

(57) ABSTRACT

In a wiring structure in which a wiring portion and a plug portion each made of a Cu material are formed integrally through a damascene process, the difference between deviation stress applied to the wiring portion in a longitudinal direction and deviation stress applied to the plug portion in a direction perpendicular to the central axis of the plug portion is controlled to be 220 MPa or less.

8 Claims, 25 Drawing Sheets

DEVIATION STRESS REPRESENTATION

ATOMS AT GRAIN BOUNDARY FLOW USING DIFFERENCE BETWEEN
DEVIATION STRESS ① AND ② PERPENDICULAR TO GRAIN BOUNDARY AS DRIVING FORCE

GROWTH RATE OF VOID AREA $$\frac{dS}{dt} = J_b \delta_b \Omega = \frac{D_b \delta_b \Omega}{kT} \frac{\partial \sigma}{\partial x}$$

$J_b$; CU FLUX AT GRAIN BOUNDARY
$\delta_b$; THICKNESS OF DIFFUSION LAYER
$\Omega$ VOLUME OF DIFFUSED ATOMS

GROWTH RATE OF VOID IS PROPORTIONAL
TO SLOPE OF VERTICAL STRESS

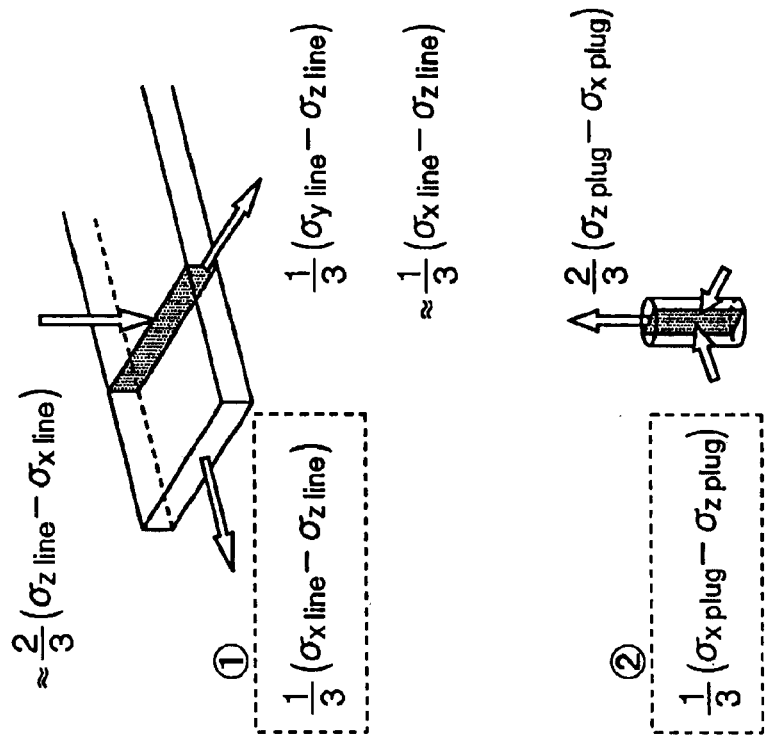
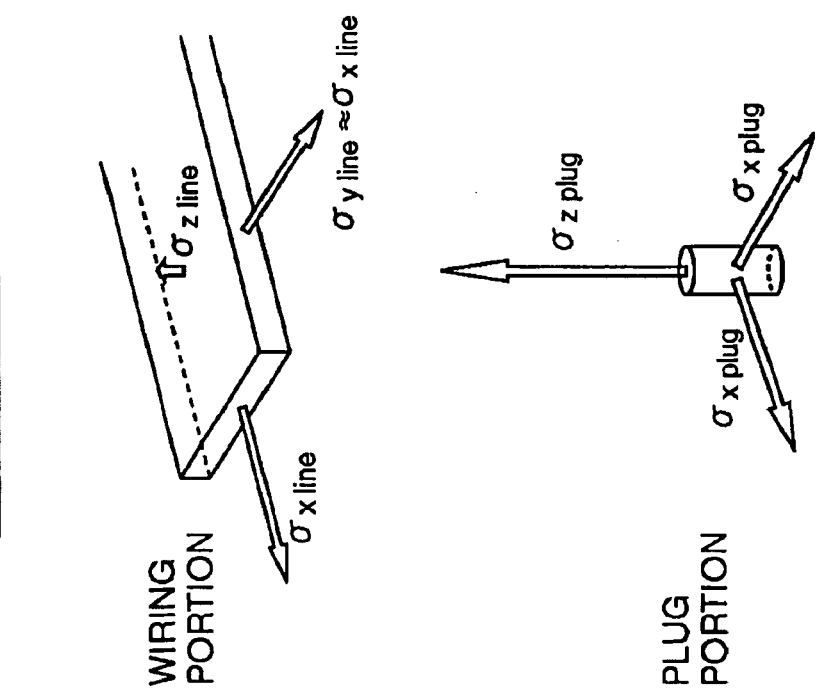
FIG. 2A / FIG. 2B
ATOMS AT GRAIN BOUNDARY FLOW USING DIFFERENCE BETWEEN DEVIATION STRESS ① AND ② PERPENDICULAR TO GRAIN BOUNDARY AS DRIVING FORCE

STRUCTURE DEPENDENCY OF
DIFFERENCE IN DEVIATION STRESS

- ESTIMATE STRESS FROM LATTICE CONSTANT BY X-RAY DIFFRACTION.

WIRING PORTION

PLUG PORTION

STRUCTURE OF EXPERIMENT SAMPLE

RESULT OF MEASUREMENT (WIRING)
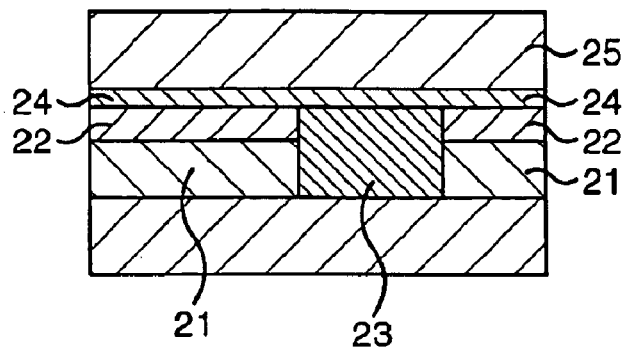
FIG. 7B
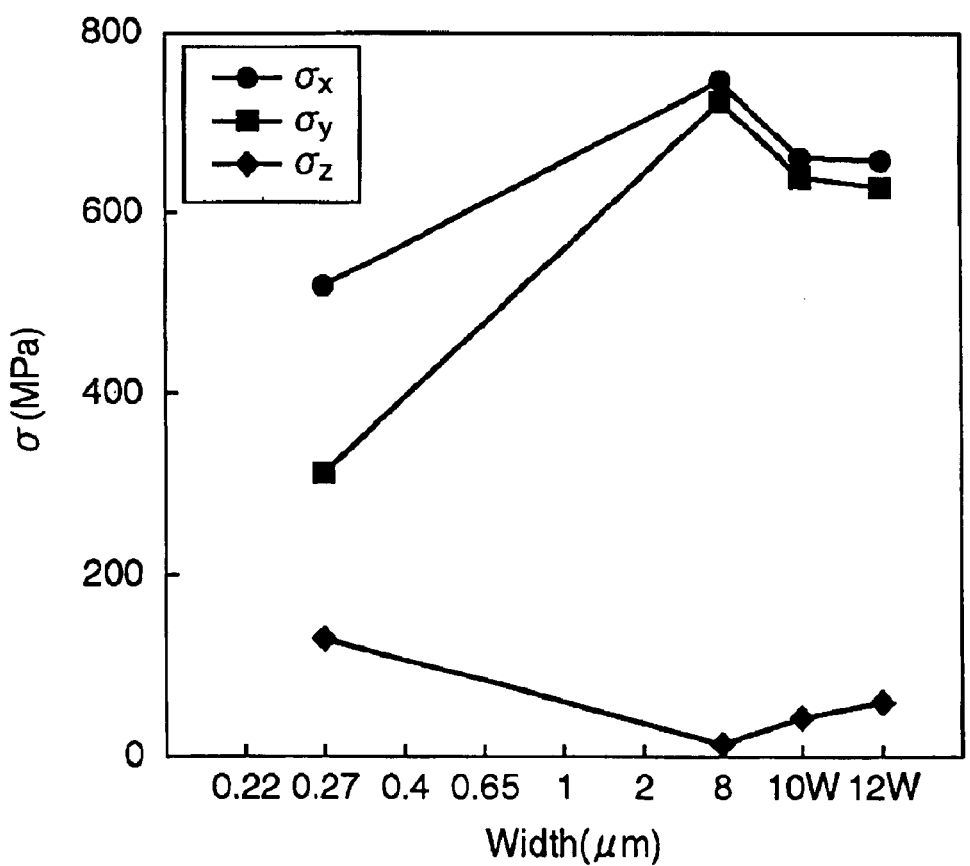
RESULT OF MEASUREMENT OF STRESS OF WIRING PORTION

EXPERIMENT OF PLUG PORTION

ANALYZE STRESS APPLIED ON Cu BY CHANGING STRESS
OF SiO₂ FILM FOR PLUG PORTION IN ②

STRUCTURE OF SAMPLE TO MEASURE
STRESS OF PLUG PORTION

DEPENDENCY OF SiO$_2$ FILM FOR PLUG PORTION
IN-PLANE DIRECTION

VERTICAL DIRECTION

RESULT OF MEASUREMENT OF STRESS OF PLUG PORTION

|  | Initial | After 1st cycle |
|---|---|---|
| Film stress | -5.56e8 | -2.51e8 |
| Delta | - | -3.05e8 |

| | Initial | After 1st cycle |
|---|---|---|
| Film stress | 6.21e8 | 6.41e8 |
| Delta | - | 0.20e8 |

|  | Initial | After 1st cycle |
|---|---|---|
| Film stress | -6.21e8 | -5.50e8 |
| Delta | - | -0.72e8 |

WIRING STRUCTURE HAVING INTEGRAL WIRING PORTION AND PLUG PORTION AND METHOD OF FORMING THE SAME

CROSS-REFERENCE TO RELATED APPLICATIONS

This application is based upon and claims the benefit of priority from the prior Japanese Patent Application No. 2002-051928, filed on Feb. 27, 2002, the entire contents of which are incorporated herein by reference.

BACKGROUND OF THE INVENTION

1. Field of the Invention

The present invention relates to a wiring structure in which a wiring portion and a plug portion are formed integrally, and a method of forming the same. The invention is particularly suitable to damascene wiring formed by filing a wiring groove made in an insulating film with a metal material.

2. Description of the Related Art

To meet the high integration of a semiconductor device and a reduction in chip size in recent years, not only the miniaturization of wiring, but also multi-layer wiring is being promoted at an increasing fast rate. With a logic device having such multi-layer wiring, a wiring delay is becoming one of dominant factors causing a device signal delay. A signal delay in the device is proportional to the product of wiring resistance and a wiring capacity, and a reduction of wiring resistance and wiring capacity becomes an issue of great importance to improve the wiring delay.

In order to reduce the wiring resistance, there has been proposed a technique of forming Cu wiring so as to fill up a wiring groove made in an insulating film through the so-called damascene method. Further, in order to reduce the wiring capacity, the use of an organic low dielectric material based on aryl ether or a low dielectric material based on fluorocarbon for the insulating film instead of conventionally used $SiO_2$ has been examined. These materials have a dielectric constant of 2.3 to 2.5, which is approximately 40% to 55% lower than that of the conventional insulation materials, such as $SiO_2$, SiN, and SiON. It is expected that combining a low dielectric film with Cu wiring particularly in a global wiring portion, which is assumed to have a large influence upon the wiring delay, will make a significant contribution to improvement of the device performance.

However, the conventional damascene method has the following problem when a $SiO_2$ film used as the insulating film for the Cu wiring is replaced with a low dielectric film.

That is, in general, a low dielectric material achieves a low dielectric constant by lowering the film density. Hence, a low dielectric film has low heat conductivity and poor mechanical strength in comparison with the $SiO_2$ film. On the other hand, in order to meet the advancement of technology, it is general to improve the device performance of the logic device by increasing the allowable current density. An increase in allowable current density means an increase in Joule heat generated when a current flows through the wiring portion, and how efficiently the heat generated from Joule heat is released to a silicon substrate becomes a big problem as the technology advances further. This problem, in particular, becomes serious when a low dielectric material having small heat conductivity is used.

Further, when a low dielectric film having poor mechanical strength is used as the insulating film, there is a problem that film separation or cracking occurs in the dicing process or wire bonding process following the wafer process due to application of considerably large shear stress, compressive stress, or tensile stress.

SUMMARY OF THE INVENTION

An object of the present invention is to provide a wiring structure having extremely high wiring reliability, which is formed based on a universal judgment reference established for the wiring structure independently of the forms, such as a structure and a material of an insulating film in which the wiring structure is formed, and can thus not only maintain sufficient mechanical strength, but also improve a stress migration characteristic remarkably even when a low dielectric material is used in part of the insulating film, and a method of forming the wiring structure.

The inventor has conducted an assiduous study and reached various embodiments of the invention as follows.

A wiring structure of the invention includes a wiring portion overlaid to extend above a substrate, and a plug portion formed integrally with the wiring portion, wherein a difference between deviation stress applied to the wiring portion in a longitudinal direction and deviation stress applied to the plug portion in a direction perpendicular to a central axis thereof is 220 MPa or less at a room temperature.

A wiring structure of the invention includes a plug portion formed so as to fill up an opening made in a first insulating film, and a wiring portion formed integrally with the plug portion and overlaid to extend above a substrate, at least part of a side surface thereof being covered with a second insulating film, wherein a ratio of film stress of the second insulating film to film stress of the first insulating film is 1.58 or less.

A method of forming a wiring structure of the invention includes the step of making an opening in a first insulating film and a wiring groove continuing from the opening at least in a second insulating film, and the step of filling up the opening and the wiring groove with metal containing at least copper, wherein the first insulating film and the second insulating film are formed so that a ratio of film stress of the second insulating film to film stress of the first insulating film is 1.58 or less.

BRIEF DESCRIPTION OF THE DRAWINGS

FIGS. 2A and 2B are schematic views respectively explaining stress and deviation stress applied to a wiring portion and a plug portion forming a wiring structure;

FIGS. 7A and 7B are a sectional view showing a state of the wiring portion used to measure film stress, and a graph showing a result of measurement, respectively;

DETAILED DESCRIPTION OF THE PREFERRED EMBODIMENTS (Basic Principle of the Invention)

Firstly, the basic principle of the invention will be explained in detail as the first and second embodiments. Herein, by way of example, a Cu wiring structure will be explained that is composed of a wiring portion and a plug portion made through the so-called damascene method by filling up, with Cu, a wiring groove and an opening made in an insulating film (at least part of which is made of a low dielectric material).

With the aim of securing sufficient mechanical strength in the Cu wiring structure through the damascene method even when a low dielectric material is used in part of the insulating film, the present inventors proposed a hybrid wiring structure (H. Kubo et al., *IITC* 2000, pp. 270–272) in which a low dielectric insulating film is used for the wiring portion whereas an insulation material (oxide film) having different mechanical strength and heat conductivity from those of the wiring portion is used for the plug portion. The hybrid structure, however, has a problem that the result of a stress migration test, which is a high-temperature shelf test, shows extremely poor wiring reliability in a case where there is a considerable difference in physical properties between the low dielectric insulating film used for the wiring portion and the oxide film used for the plug portion.

The first and second embodiments are addressed to secure sufficient mechanical strength while improving the stress migration characteristic when a low dielectric material is used in part of the insulating film particularly in the Cu wiring structure through the damascene method. To this end, attention is focused on (1) deviation stress applied to the respective portions of the wiring structure, and (2) film stress applied to the insulating film in which the wiring structure is formed and embedded, and the first and second embodiments disclose universal methods of identifying the reliability of the Cu wiring structure quantitatively by respectively adopting (1) and (2) as the reference for evaluating the reliability.

(1) Evaluation of Reliability of Wiring Structure with Reference to Deviation Stress: First Embodiment The Cu wiring structure through the damascene method has been known to cause breaking in the plug portion due to attraction of a Cu material in the plug portion toward the wiring portion. This phenomenon is attributed to various factors intertwined complicatedly with one another, such as the wiring width, the plug diameter (via diameter), a location of forming the plug portion with respect to the wiring portion (for example, the incidence of breaking naturally differs between the center and the edge of the wiring portion), a material of the insulating film, and forming conditions.

Figure 1:
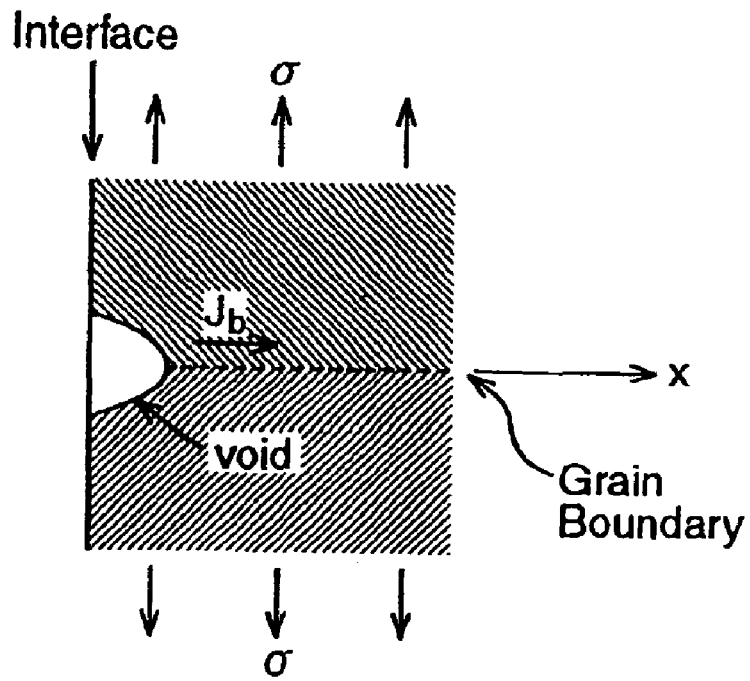
FIG. 1 is a schematic view showing a two-dimensional model causing a void at a grain boundary when vertical stress is applied thereon.

The present inventor, in an attempt to establish a definite quantitative reference for evaluating the Cu wiring structure, focused his attention on the fact that, in a two-dimensional model (see FIG. 1, Kitamura et al., *Nihon Kikai Gakkai Conference Papers*, A59 (1993) 1625) causing a void at the grain boundary when vertical stress is applied thereon, the growth rate of the void is proportional to the slope of the vertical stress. The present inventor expanded the two-dimensional model to a three-dimensional model, and achieved an idea of applying deviation stress, which is a stress component obtained by subtracting average vertical stress from the respective vertical stress components and used as the reference for plastic deformation, to the wiring structure.

Stress applied to the wiring portion and the plug portion together forming the wiring structure is represented by the orthogonal coordinate system as shown in FIG. 2A by the normal representation method. By contrast, the deviation stress is represented as shown in FIG. 2B. Since atoms at the grain boundary start to flow using a difference in deviation stress perpendicular to the grain boundary as a driving force, the present inventor conducted the following experiment as to a difference between deviation stress ① applied to the wiring portion in a longitudinal direction and deviation stress ② applied to the plug portion in a direction perpendicular to the central axis thereof, expressed as:

$$\tfrac{1}{3}(\sigma_{xline}-\sigma_{zline})-\tfrac{1}{3}(\sigma_{xplug}-\sigma_{zplug}) \quad (1)$$

Figure 3:
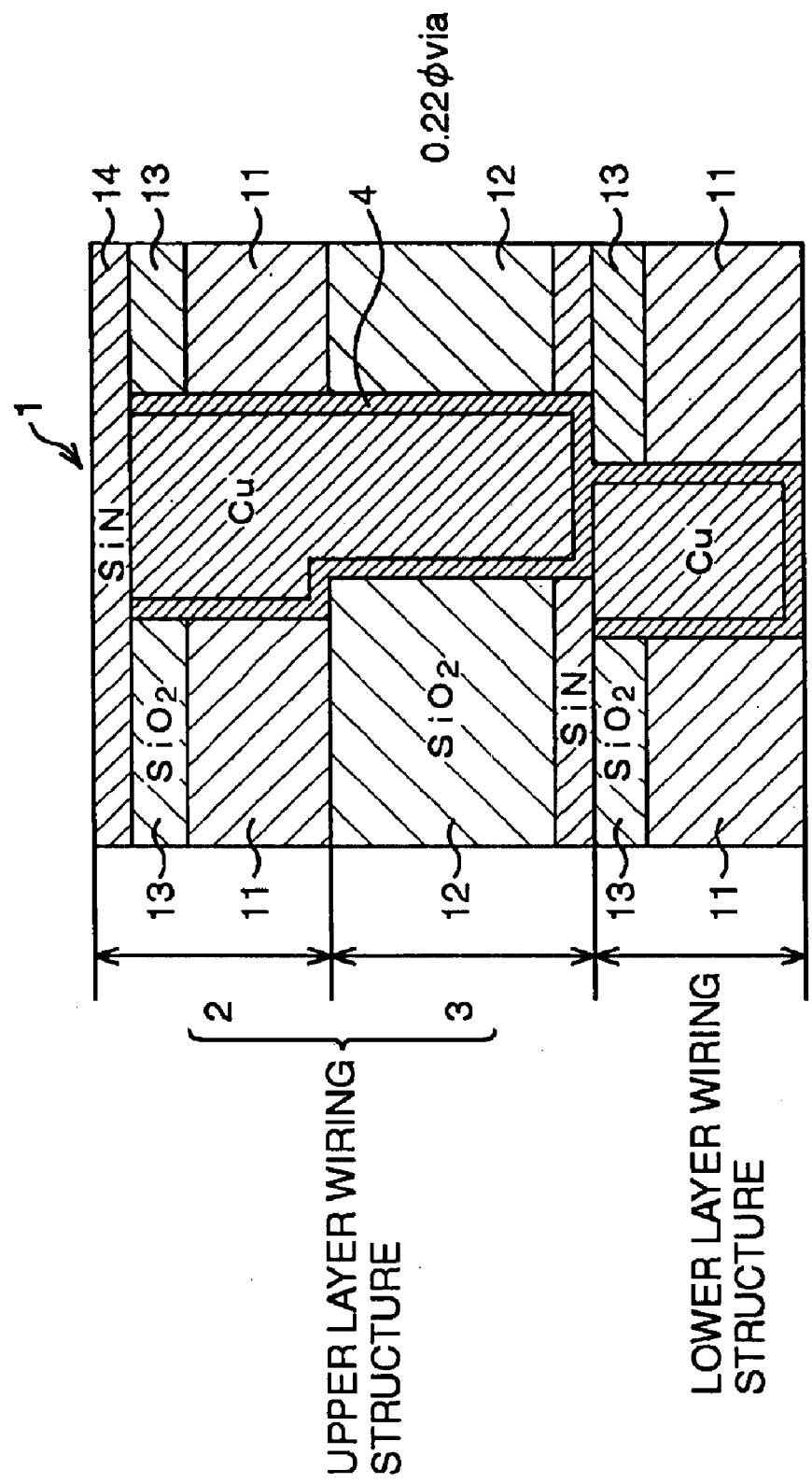
FIG. 3 is a schematic sectional view showing a hybrid wiring structure of the invention.

In this embodiment, the main subject is a hybrid wiring structure. As shown in FIG. 3, a hybrid wiring structure 1 is composed of a wiring portion 2 and a plug portion 3 both made of a Cu material and formed integrally having a TaN (or Ta) film 4 as an underlayer through the dual damascene method. The plug portion 3 is made in a $SiO_2$ film 12, and the wiring portion 2 is made in an organic low dielectric film 11 based on aryl ether and in a $SiO_2$ film 13 to be used as a polishing stopper for CMP (Chemical Mechanical Polishing). A SiN film 14 to be used as a protective film is formed on the upper surface portion. The example shown in the drawing shows a case where the wiring structure 1 is used as an upper layer wiring structure that is connected to a lower layer wiring structure of the same arrangement.

Figure 4A:
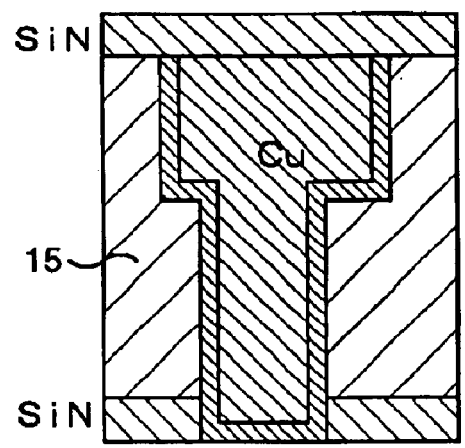
FIGS. 4A and 4B are schematic sectional views showing comparative examples of the hybrid wiring structure of the invention.
Figure 4B:
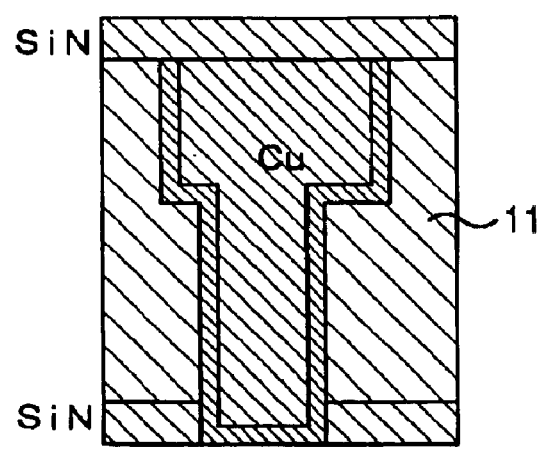

Further, as comparative examples, FIG. 4A show a case (comparative example 1) where almost the entire Cu wiring structure 1 is formed in an FSG (Fluoro Silicate Glass) film 15, and FIG. 4B shows a case (comparative example 2) where almost the entire Cu wiring structure 1 is formed in an organic low dielectric film 11 based on aryl ether.

The experiment was conducted by analyzing the relation between the wiring width ($\mu$m) and a difference value (MPa) of the deviation stress expressed by Equation (1) above while changing the plug diameter (via diameter) from 0.27 $\mu$m to 1.0 $\mu$m at a room temperature (20° C. to 30° C., herein 23° C.) for the hybrid wiring structure of this embodiment and the comparative examples 1 and 2. As to the comparative example 2, the relation was analyzed only for the plug diameter of 0.27 $\mu$m. An arrow A indicates an actually measured value at 200° C. and a bold solid line indicates a value at 200° C. inferred from the actually measured value.

Figure 5A:
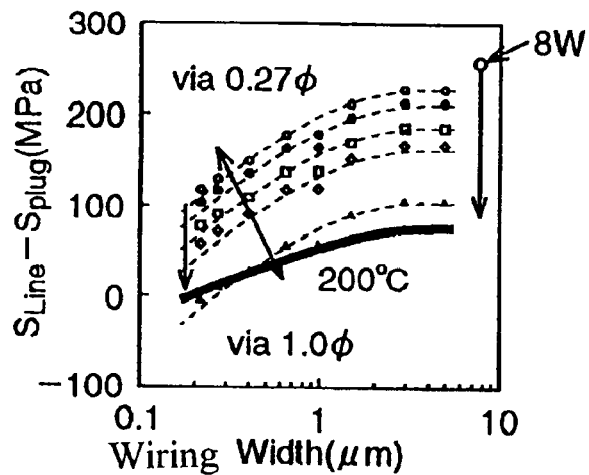
FIGS. 5A through 5C are graphs when the relation between a wiring width ($\mu$m) and a difference value (MPa) of the deviation stress is analyzed while changing a plug diameter (via diameter) from 0.27 $\mu$m to 1.0 $\mu$m.
Figure 5B:
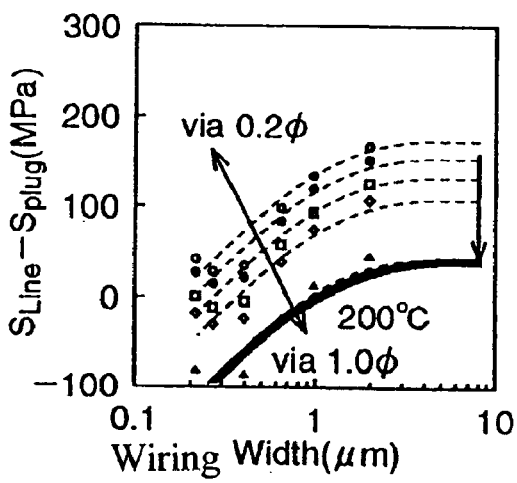
Figure 5C:
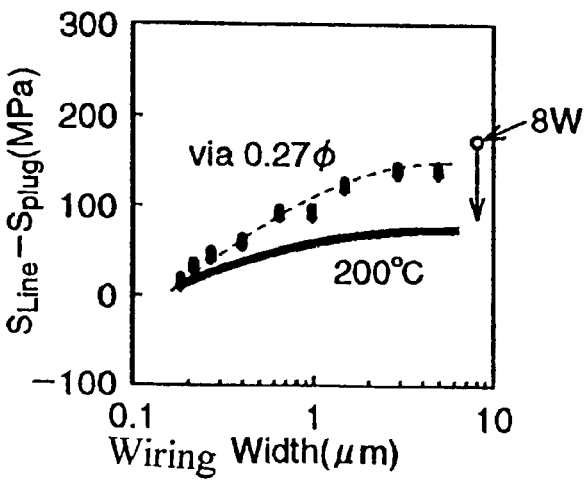

The results of the experiment are set forth in FIGS. 5A through 5C. FIG. 5A shows the result of the hybrid wiring structure of this embodiment, FIG. 5B shows the result of the comparative example 1, and FIG. 5C shows the result of the comparative example 2.

These drawings reveal that there is a similar tendency in each case that a difference value in deviation stress increases with an increase in wiring width, and this tendency becomes more noticeable as the plug diameter becomes smaller. This is consistent with the tendency that breaking or the like occurs more frequently as the wiring width becomes larger and the plug diameter becomes smaller.

Hence, in this embodiment, a difference value in deviation stress is adopted as a universal quantitative reference for the wiring reliability, established independently of the forms (the material and film thickness of the insulating film, a location of forming the plug portion with respect to the wiring portion, etc.) of the wiring structure, and the guiding principle is established from various data chiefly obtained from the results of measurement set forth in FIGS. 5A through 5C that a wiring structure has sufficient reliability when a difference value in deviation stress is 220 MPa or less.

As has been described, this embodiment proposes a wiring structure formed in such a manner that a difference value between the deviation stress applied to the wiring portion in a longitudinal direction and the deviation stress applied to the plug portion in a direction perpendicular to the central axis thereof is 220 MPa or less. Consequently, there can be achieved a wiring structure having extremely high wiring reliability, which can not only maintain sufficient mechanical strength, but also improve the stress migration characteristic remarkably even when a low dielectric material (for example, an organic low dielectric film based on aryl ether) is used in part of the insulating film.

(2) Evaluation of Reliability of Wiring Structure with Reference to Film Stress Applied to Insulating Film: Second Embodiment Differently from the evaluation of the reliability discussed in (1) above, this embodiment uses, as a universal quantitative reference for the wiring reliability, the film stress of the insulating film in which the Cu wiring structure is formed, which will be described below.

Figure 6A:
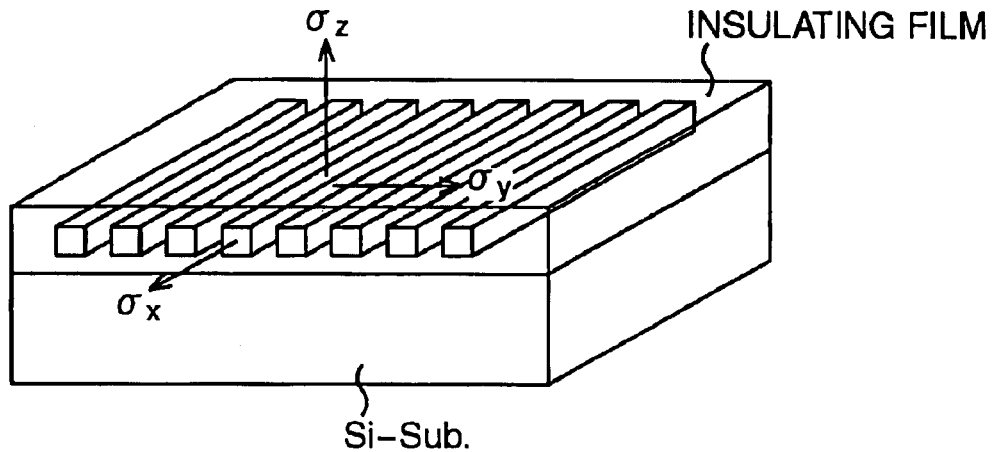
FIGS. 6A and 6B are schematic perspective views respectively showing states when the wiring portion and the plug portion made of a Cu material are formed on silicon substrates.
Figure 6B:
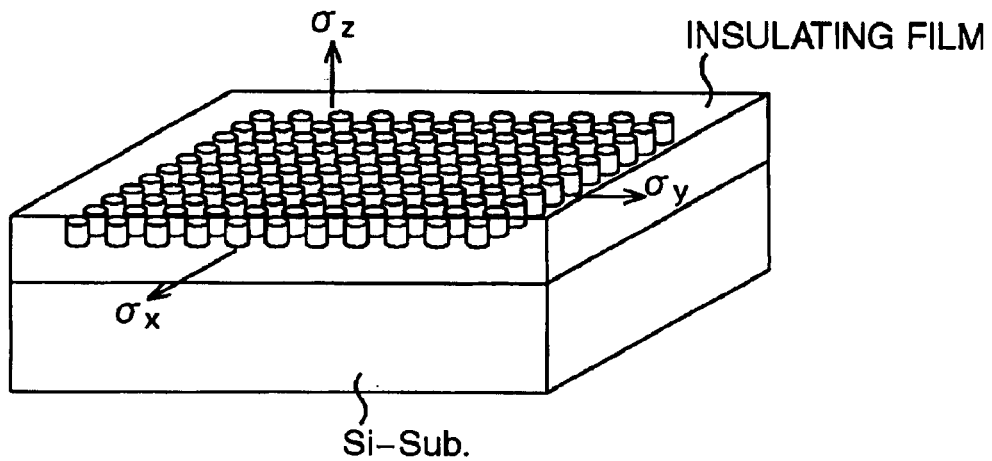

In the hybrid wiring structure, it is assumed that the occurrence of breaking or the like would be controllable if a difference between the film stress of the insulating film for the wiring portion and the stress of the plug portion can be lessened. Thus, as shown in FIGS. 6A and 6B, the wiring portion (FIG. 6A) and the plug portion (FIG. 6B) both made of a Cu material are respectively formed on the silicon substrates, and the stress in the wiring and plug portions was estimated through the X-ray diffraction method.

FIG. 7A is a schematic sectional view of the wiring portion used to measure the film stress and FIG. 7B is a graph showing the result of measurement.

The wiring portion used to measure the film stress has a $SiO_2$ film 22 (film thickness: 100 nm) to be used as a polishing stopper for CMP on an aromatic hydrocarbon polymer film 21 (hereinafter, abbreviated to the AHCP film, film thickness: 150 nm). A wiring portion 23 made of Cu and having a film thickness of 250 nm is formed in this lamination structure. A SiN film 24 (film thickness: 70 nm) and a $SiO_2$ film 25 (film thickness: 400 nm) are formed sequentially on the wiring portion 23 through a plasma CVD method. The stress of the wiring portion 23 was measured while changing the wiring width from 0.22 $\mu$m to 12 $\mu$m. As can be understood from FIG. 7B, the tensile stress in the x and y directions, that is, the tensile stress in plane directions, increases relatively with respect to the tensile stress in the z direction with an increase in wiring width. In short, the stress within the wiring portion approximates to the plane stress with an increase in wiring width.

Figure 8:
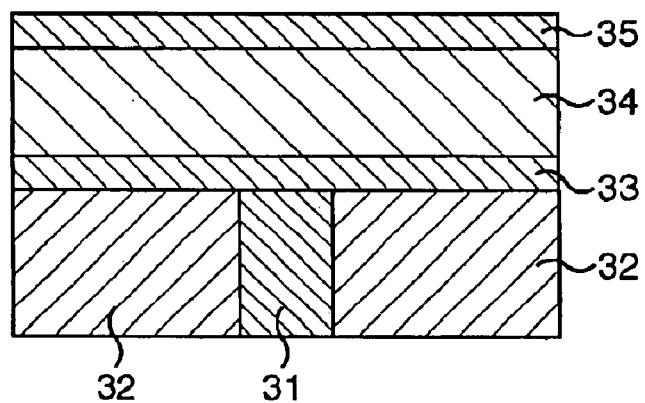
FIG. 8 is a schematic sectional view of a plug portion used to measure the film stress.

FIG. 8 is a schematic sectional view of the plug portion used to measure the film stress.

A plug portion 31 used to measure the film stress is formed so as to fully fill up an opening (via hole) made in a $SiO_2$ film 32 (film thickness: 300 nm). A SiN film 33 (film thickness: 70 nm) is formed on the plug portion 31 through a plasma CVD method, followed by an aromatic hydrocarbon polymer film 34 (film thickness: 150 nm), on which a $SiO_2$ film 35 (film thickness: 100 nm) is further formed through a plasma CVD method. With this sample, the experiment was conducted by changing the film stress of the $SiO_2$ film 32 in which the plug portion 31 is formed.

Figure 9A:
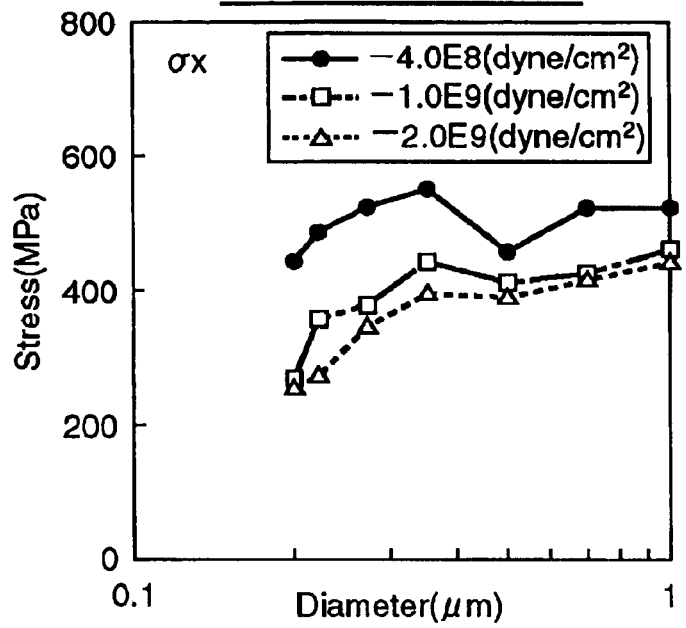
FIGS. 9A and 9B are graphs showing the relation of the film stress of a $SiO_2$ film with respect to different plug diameters (via diameters)
Figure 9B:
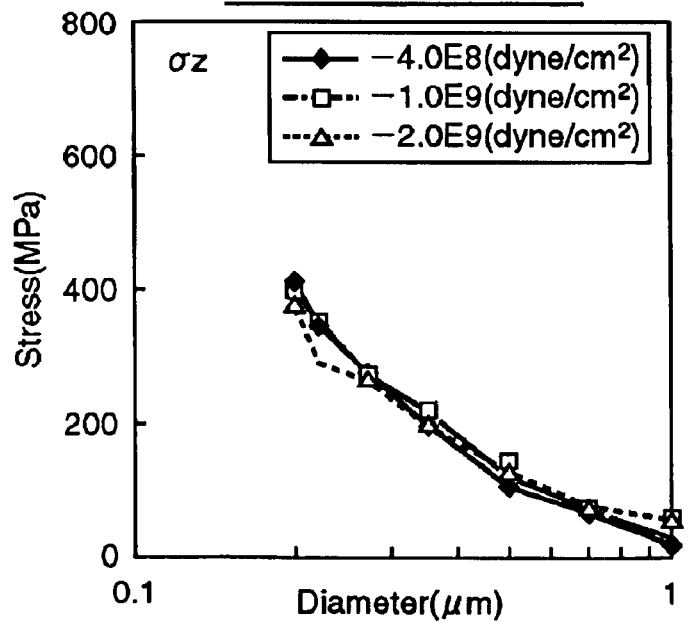

FIGS. 9A and 9B are graphs showing the relation of the stress of the plug portion 31 with respect to different plug diameters (via diameters).

It is revealed that the tensile stress in the x and y directions increases with an increase in via diameter. On the other hand, in regard to the tensile stress in the z direction, it is apparent that the tensile stress induced in the plug portion 31 decreases with an increase in via diameter. Further, by focusing attention on the relation between the magnitude of the film stress of the $SiO_2$ film 32 and the stress induced in the plug portion 31, it is understood that the tensile stress in the x and y directions decreases with an increase in the film stress of the $SiO_2$ film 32 used for the plug portion 31. On the other hand, the tensile stress in the z direction remained nearly at the constant value even when the film stress of the $SiO_2$ film 32 is changed.

When the stress migration is discussed based on FIG. 7B and FIGS. 9A and 9B, breaking defects occur more frequently as a difference in tensile stress in the x, y, and z directions between the wiring portion 23 and the plug portion 31 becomes greater due to attraction of the Cu material forming the plug portion 31 in the wiring direction. In the lamination structure of the AHCP film 21 and the $SiO_2$ film 22 of FIG. 7A, it is apparent from FIG. 7B that greater tensile stress is induced in the x and y directions in the wiring portion 23 as the wiring width increases, whereas the stress in the z direction in the plug portion 31 remains almost constant independently of the film stress of the $SiO_2$ film 32 used for the plug portion 31. This means that the Cu material forming the plug portion 31 is attracted more in the wiring direction as the tensile stress in the x and y directions induced in the plug portion 31 decreases.

In view of these facts obtained from the experiments, the wiring structure shown in FIG. 3 was subjected to a stress migration test while changing the film stress of the $SiO_2$ film 32 for the plug portion 31. In this test, the wiring structure having the via diameter of 0.22 μm was allowed to stand at 200° C. for 168 hours.

Figure 10:
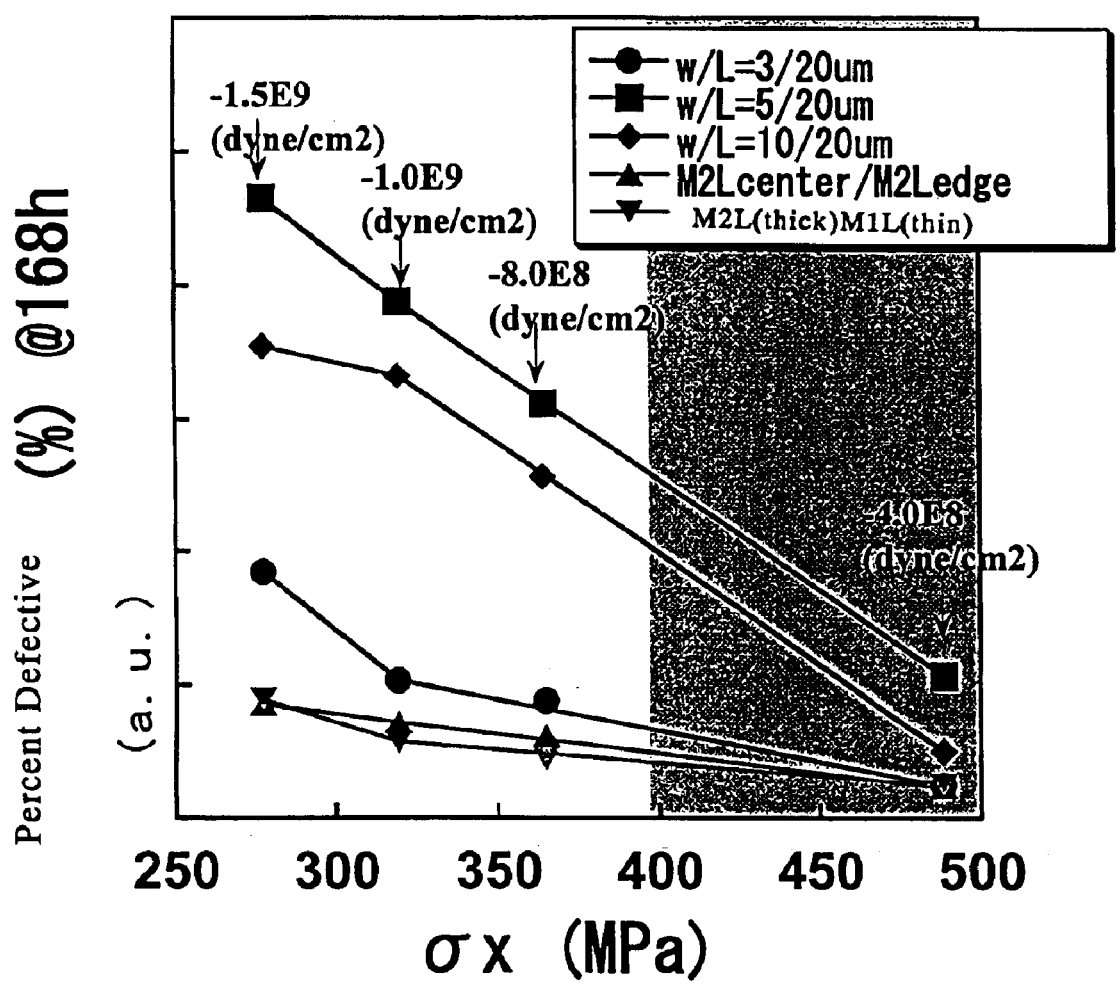
FIG. 10 is a graph showing percent defective with respect to tensile stress in the x direction induced in the plug portion in a stress migration test when a $SiO_2$ film is used as an insulating film for the plug portion.

FIG. 10 is a graph showing percent defective in the stress migration test with respect to the tensile stress in the x direction induced in the plug portion when the SiO2 film was used as the insulating film for the plug portion.

The percent defective was checked in three samples: a sample having a wiring width of 3 μm and a wiring length of 20 μm; a sample having a wiring width of 5 μm and a wiring length of 20 μm; and a sample having a wiring width of 10 μm and a wiring length of 20 μm. As is apparent from FIG. 10, the higher the stress in an in-plane direction is, the lower the percent defective is. In other words, the stress migration defects are reduced as a difference in tensile stress between the wiring portion and the plug portion is narrow. This can be achieved by narrowing a difference between the film stress of the insulating film for the wiring portion and the film stress of the insulating film for the plug portion.

Besides the film stress, physical quantities presumably having relations to the stress migration in the respective insulating films are a coefficient of thermal expansion and a Young's modulus. These physical quantities, however, show any noticeable difference between the respective insulating films as set forth in Table 1 below. Hence, it is reasonable to infer that what influences the stress migration most is the film stress.

TABLE 1

| materials | Young's modulus (MPa) | Poisson ratio | thermal expansion coefficient (ppm) |
|---|---|---|---|
| organic low dielectric Si | 2450 | 0.34 | 69.0 |
| $SiO_2$ | 70000 | 0.17 | 0.6 |
| Fused Silica | 70000 | 0.17 | 0.6 |
| TEOS | 91900 | 0.16 | 0.56 |
| PSG | 70000 | 0.28 | 0.46 |
| NSG $SiO_2$ | 82000 | 0.18 | 0.55 |
| NSG $SiO_2$ | 62000 | 0.18 | 0.55 |
| PSG | 80000 | 0.18 | 0.87 |
| BSG | 131000 | 0.18 | 0.86 |

In view of the foregoing, the following description will estimate more concrete allowable values as to a difference between the film stress of the insulating film for the wiring portion and the film stress of the insulating film for the plug portion in the hybrid wiring structure.

Figure 16:
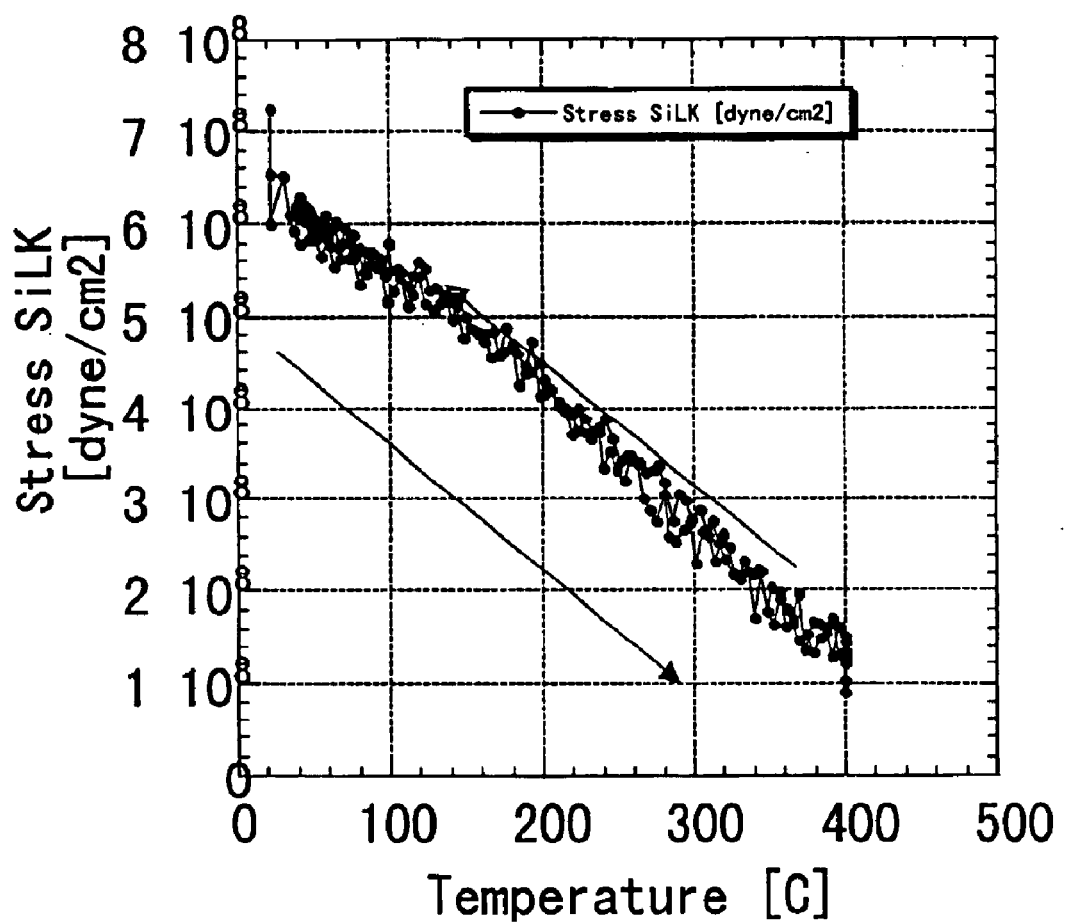
FIG. 16 is a graph showing the relation between temperatures and stress hysteresis of the insulating film for the wiring portion.
Figure 17:
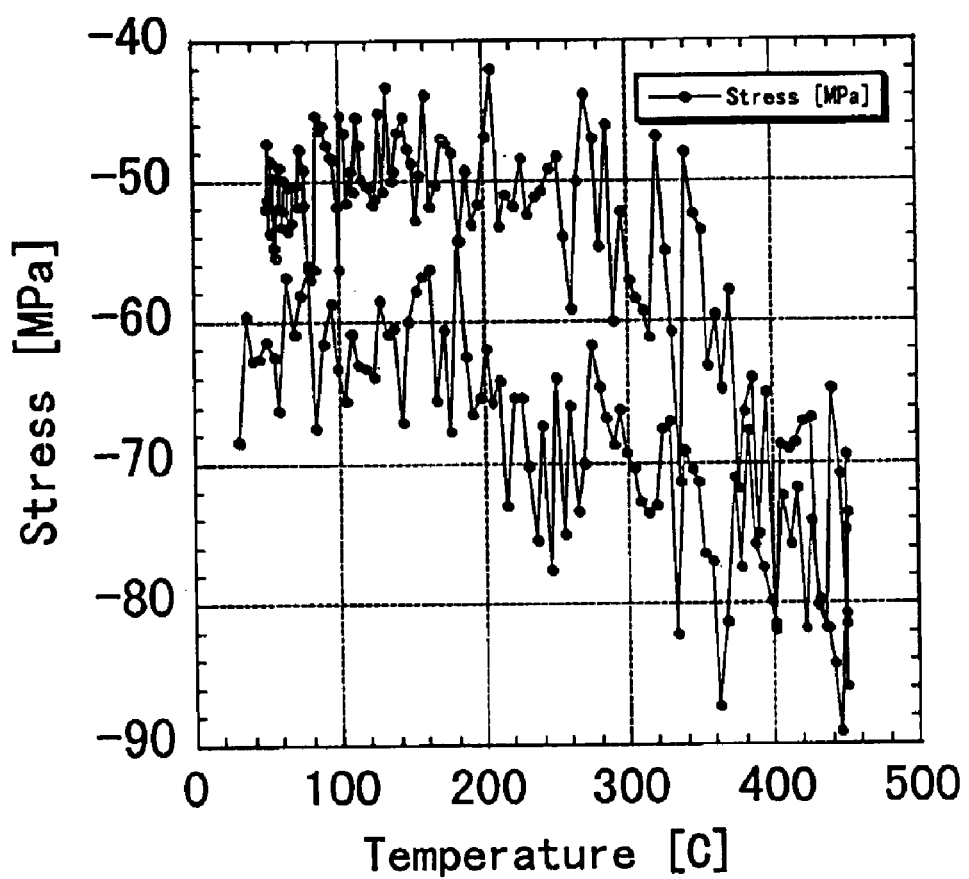
FIG. 17 is a graph showing the relation between temperatures and stress hysteresis of the insulating film for the wiring portion.

FIGS. 11 through 15 are graphs showing the relations between temperatures and stress hysteresis in the respective insulating films for the plug portion. FIGS. 16 and 17 are graphs showing the relations between temperatures and stress hysteresis in the respective insulating films for the wiring portion.

In the experiments of FIGS. 11 through 15, the temperature was raised from a room temperature to 400° C. and then dropped to a room temperature in one cycle, which was repeated three times, and the hysteresis was analyzed in each cycle. In the experiments of FIGS. 16 and 17, the temperature was raised from a room temperature to 400° C. and then dropped to a room temperature in the same manner in one cycle, and the one-cycle hysteresis was analyzed.

Figure 11:
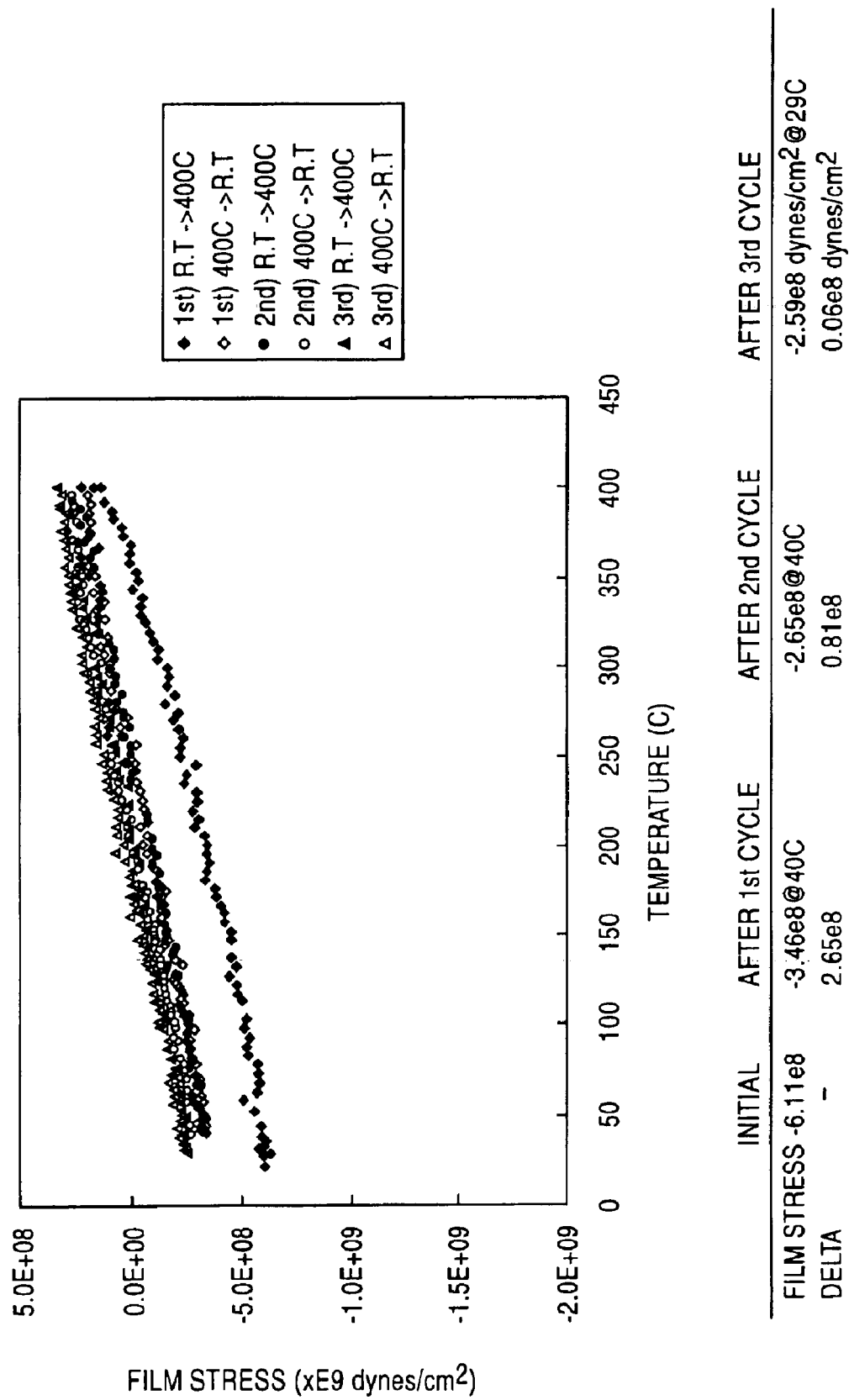
FIG. 11 is a graph showing the relation between temperatures and stress hysteresis of the insulating film for the plug portion.
Figure 12:
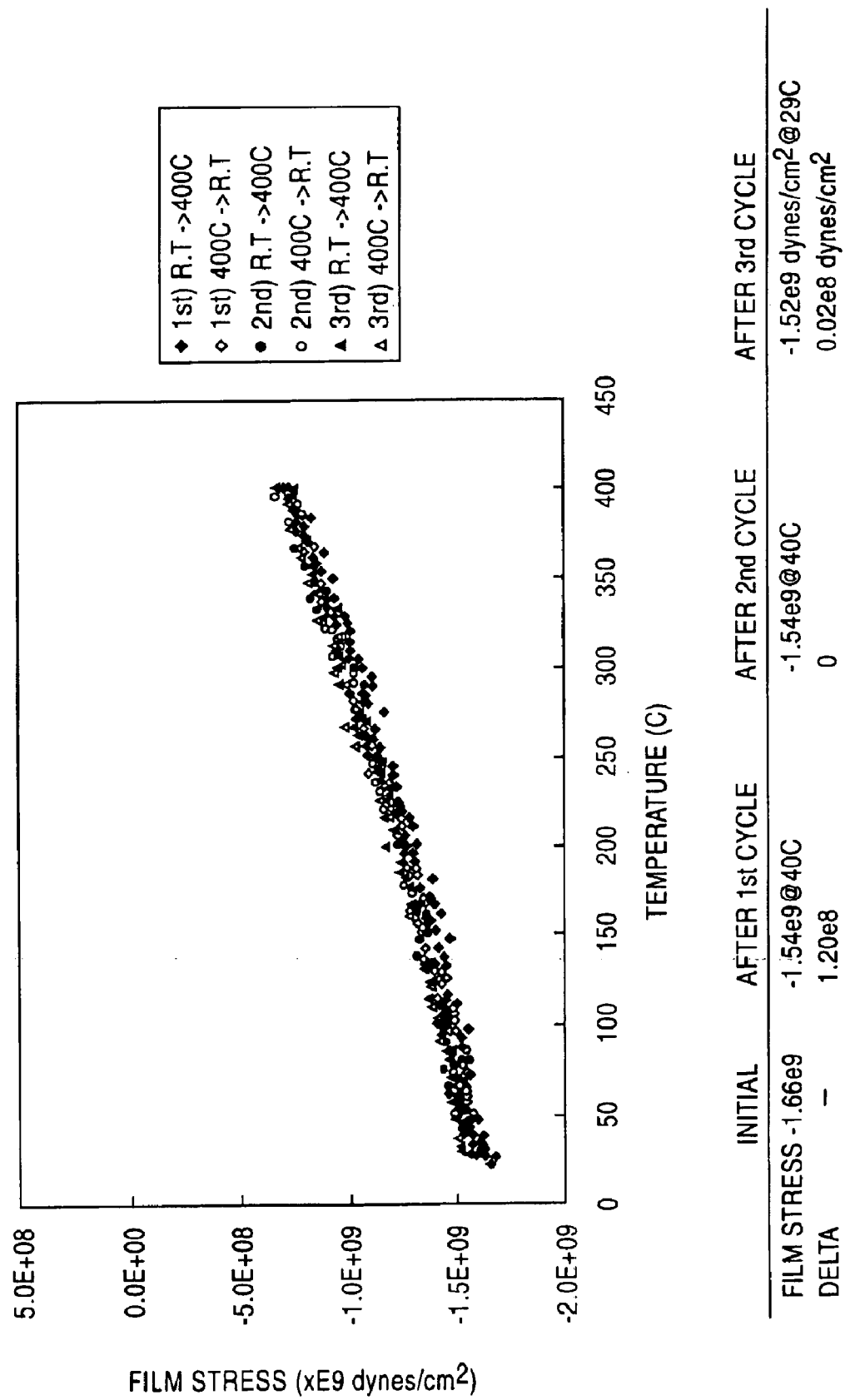
FIG. 12 is a graph showing the relation between temperatures and stress hysteresis of the insulating film for the plug portion.
Figure 13:
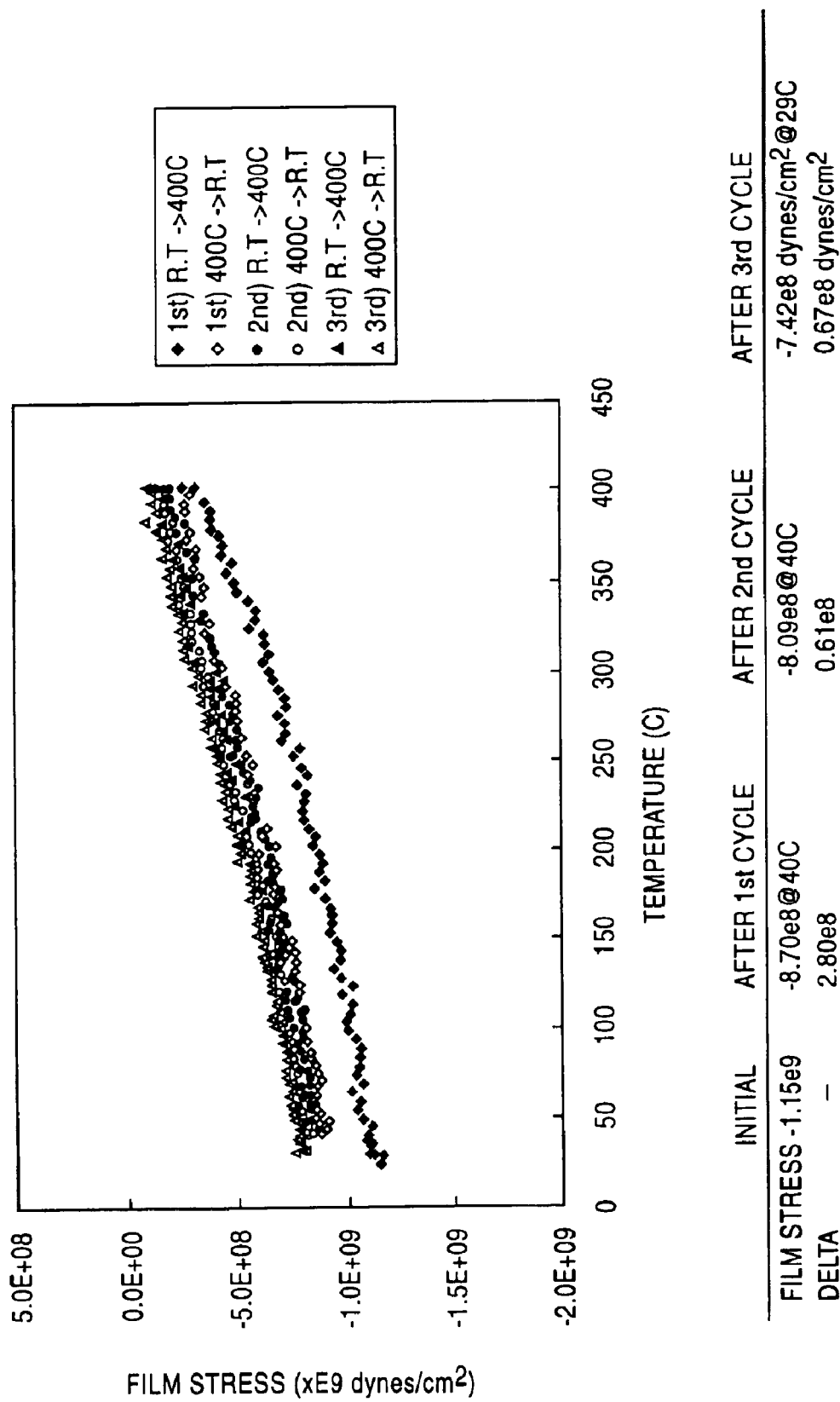
FIG. 13 is a graph showing the relation between temperatures and stress hysteresis of the insulating film for the plug portion.
Figure 14:
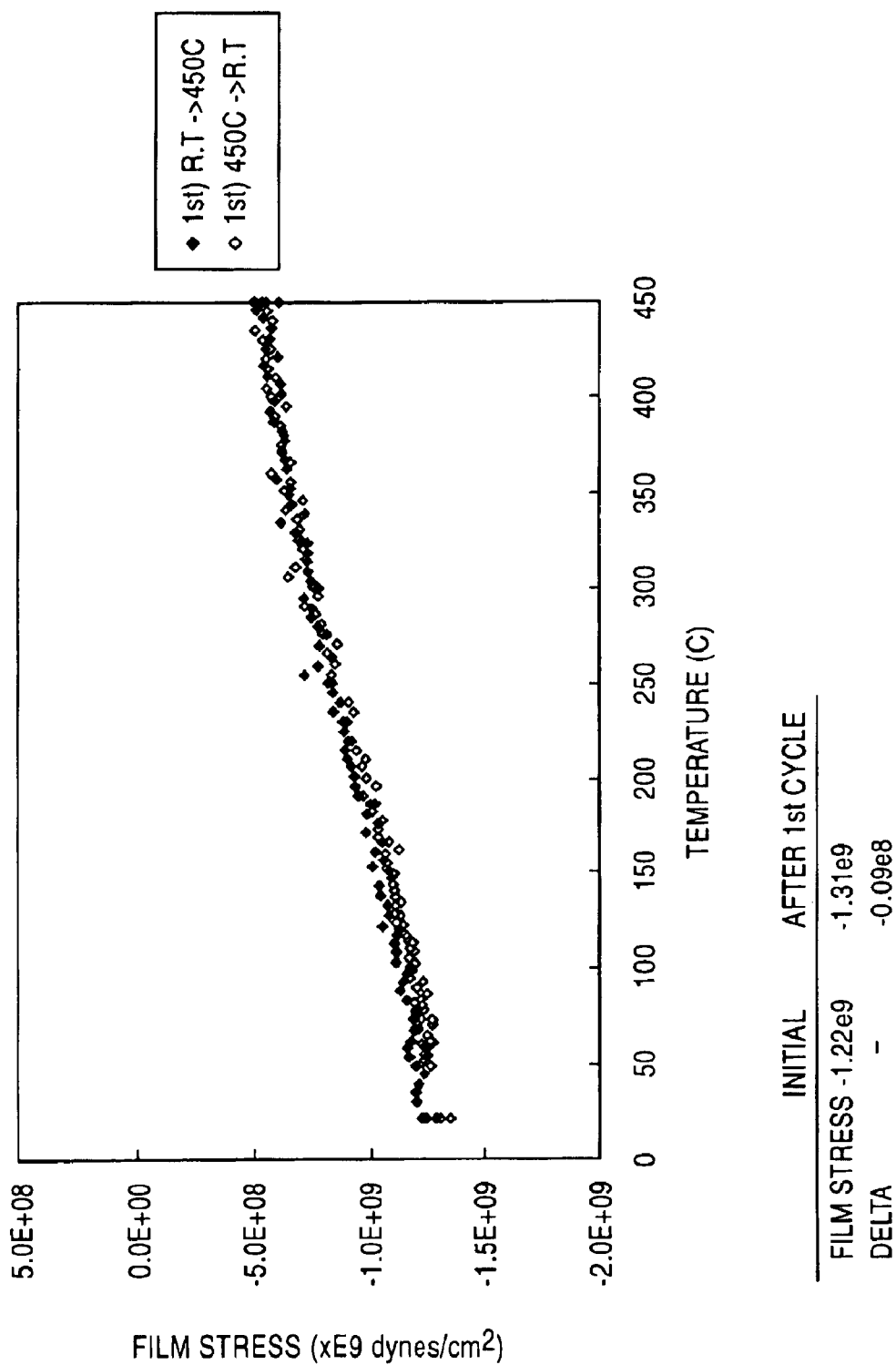
FIG. 14 is a graph showing the relation between temperatures and stress hysteresis of the insulating film for the plug portion.
Figure 15:
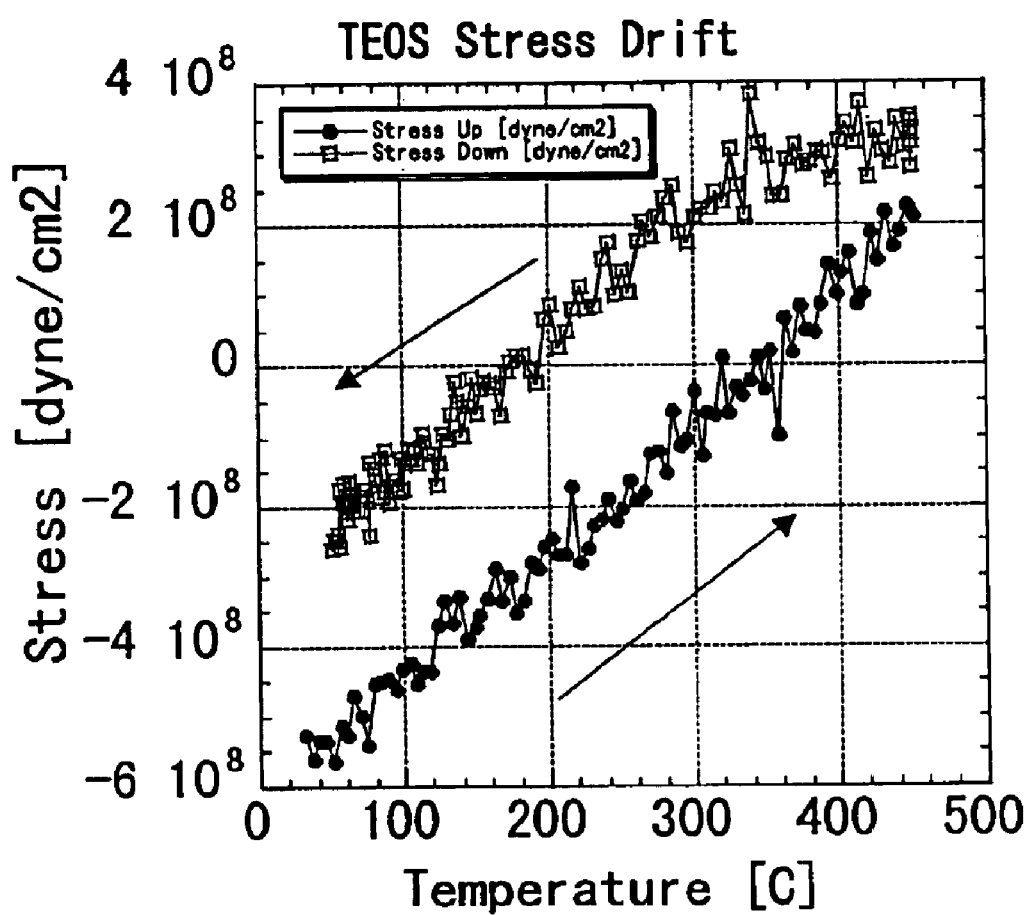
FIG. 15 is a graph showing the relation between temperatures and stress hysteresis of the insulating film for the plug portion.

Samples of the insulating film were: a $SiO_2$ film (film thickness: 750 nm) formed through a plasma CVD method using a parallel flat plasma CVD device in FIG. 11; a $SiO_2$ film (film thickness: 750 nm) formed through a high-density plasma CVD method in FIG. 12; a $SiO_2$ film (film thickness: 750 nm) formed through, a high-density plasma CVD method in FIG. 13; a $SiO_2$ film (film thickness: 500 nm) formed through a plasma CVD method using a parallel flat plasma CVD device in FIG. 14; and a TEOS-$SiO_2$ film (film thickness: 500 nm) formed through a plasma CVD method in FIG. 15.

Also, samples of the insulating film were: an organic low dielectric film based on aryl ether (film thickness: 600 nm) in FIG. 16; and an organic low dielectric film based on aryl ether (film thickness: 150 nm) and a $SiO_2$ film (film thickness: 100 nm) formed through a plasma CVD method in FIG. 17.

Since heat treatment was applied to the insulating film for the wiring portion in one cycle, the stress hysteresis of the wiring portion was compared with the stress hysteresis of the insulating film for the plug portion after the first cycle. The measurement data corresponds to the stress migration of the hybrid wiring structure of FIG. 10, and for those attaining the lowest percent defective, a ratio of the film stress of the insulating film for the wiring portion and that of the insulating film for the plug portion is:

5.5/3.46≈1.58.

Hence, in this embodiment, a ratio (or a difference) of the film stress of the insulating film for the plug portion to that of the insulating film for the wiring portion is adopted as a universal quantitative reference for the wiring reliability of the hybrid wiring structure, established independently of the various forms (a material and the film thickness of the insulating film, a formed location of the plug portion with respect to the wiring portion, etc.) of the wiring structure, and the guiding principle is established that a wiring structure has sufficient reliability when the ratio is 1.58 or less.

In this case, it is preferable to control the film stress of the insulating film for the wiring portion to stay in a range from −9×10⁸ to −3×10⁸ (dyne/cm²), and the film stress of the insulating film for the plug portion to stay at −6×10⁹ (dyne/cm²) or less on the premises that the ratio will be set to 1.58 or less.

As has been described, this embodiment proposes a hybrid wiring structure formed in such a manner that the ratio of the film stress of the insulating film for the plug portion to that of the insulating film for the wiring portion is 1.58 or less. Consequently, there can be achieved a hybrid wiring structure having extremely high wiring reliability, which can not only maintain sufficient mechanical strength, but also improve the stress migration characteristic remarkably.

(Concrete Arrangement of Hybrid Wiring Structure: Third Embodiment)

The following description will give a concrete example for forming a hybrid wiring structure based on the evaluation of reliability of the wiring structure discussed in the second embodiment above.

FIG. 18A through FIG. 24C are schematic sectional views showing fabrication sequences in a method of forming a hybrid wiring structure of this embodiment.

Figure 18A:
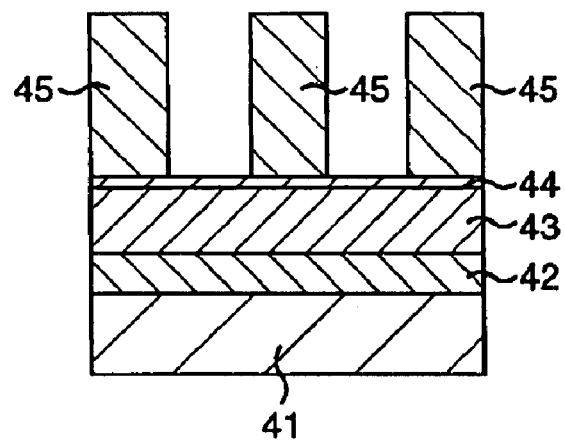
FIGS. 18A and 18B are schematic sectional views showing a fabrication sequence in a method of forming a hybrid wiring structure of the third embodiment.

Initially, as shown in FIG. 18A, after a semiconductor device (not shown), such as a MOS transistor, is formed on a silicon substrate 41, an organic low dielectric film (film thickness: 150 nm) based on aryl ether to be used as an insulating film 42 is formed thereon followed by a SiO₂ film 43 (film thickness: 250 nm), on which an anti-reflection film 44 is formed to prevent reflection from the under layer. Then, photoresist is applied on the anti-reflection film 44, and made into a resist pattern 45 in the shape of a first wiring groove through photolithography.

In regard to the insulating film 42, the organic low dielectric film based on aryl ether may be replaced with a low dielectric film based on fluorocarbon, a low dielectric film based on hydrogen silsesquioxane, a low dielectric film based on hydromethyl silsesquioxane, a low dielectric film based on porous quioxane, an organosilicate glass film, or a low dielectric film based on porous aryl ether. Also, instead of the SiO₂ film, a plasma SiON film, a plasma SiN film, or a SiC film (SiC: H film) may be suitably formed on the insulating film 42.

Figure 18B:
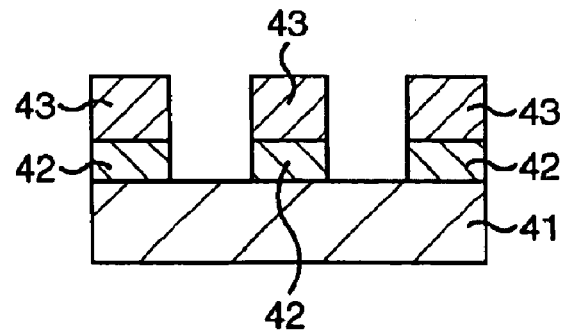

Subsequently, as shown in FIG. 18B, the anti-reflection film 44, the SiO₂ film 43, and the insulating film 42 are subjected to plasma etching using the resist pattern 45 as a mask, and a wiring groove 45 is thereby formed. Afterwards, unwanted resist pattern 45 and anti-reflection film 44 are removed.

Figure 19A:
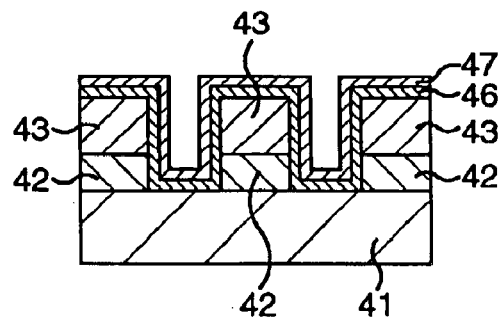
FIGS. 19A through 19C are schematic sectional views subsequent to FIG. 18B, showing a fabrication sequence in the method of forming the hybrid wiring structure of the third embodiment.

Subsequently, as shown in FIG. 19A, a Ta film (film thickness: 15 nm) or a TaN film (film thickness: 15 nm) to be used as a barrier metal film 46 is formed to cover the inner wall surface of the wiring groove 45 through a sputtering method. Then, a plated electrode film 47 (film thickness: 130 nm) is formed on the barrier metal film 46.

Figure 19B:
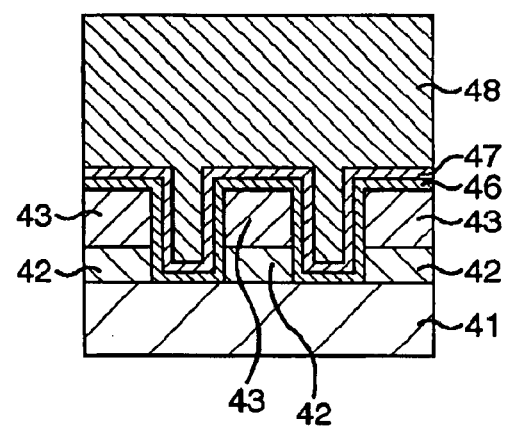
Figure 19C:
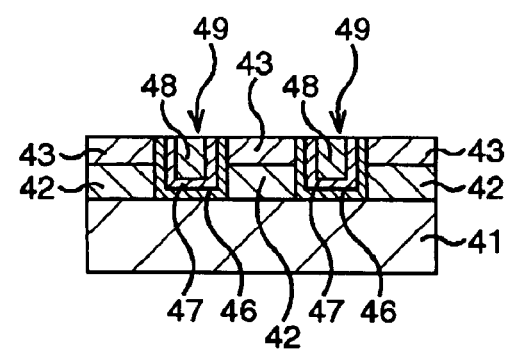

Subsequently, as shown in FIG. 19B, a Cu film 48 is formed through an electrical plating method until the film thickness reaches 970 nm. Then, as shown in FIG. 19C, the Cu film 48 and the barrier metal film 46 are polished through a CMP method, and wiring 49 is thus formed by filling up the wiring groove with Cu with the barrier metal film 46 being interposed.

Figure 20A:
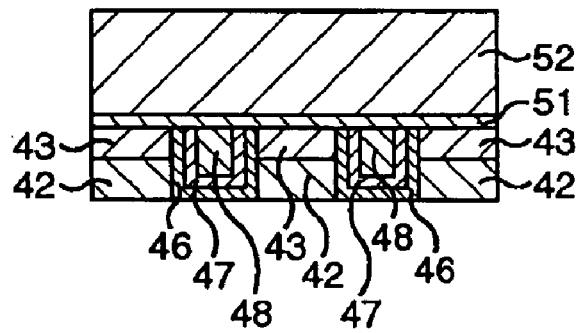
FIGS. 20A and 20B are schematic sectional views subsequent to FIG. 19C, showing a fabrication sequence in the method of forming the hybrid wiring structure of the third embodiment.

Subsequently, as shown in FIG. 20A, a SiN film 51 (film thickness: 70 nm) and a SiO₂ film (film thickness: 280 nm) to be used as a first insulating film 52 serving as an insulating film for the plug portion as will be described below are formed sequentially on the wiring 49 through a plasma CVD method.

Figure 20B:
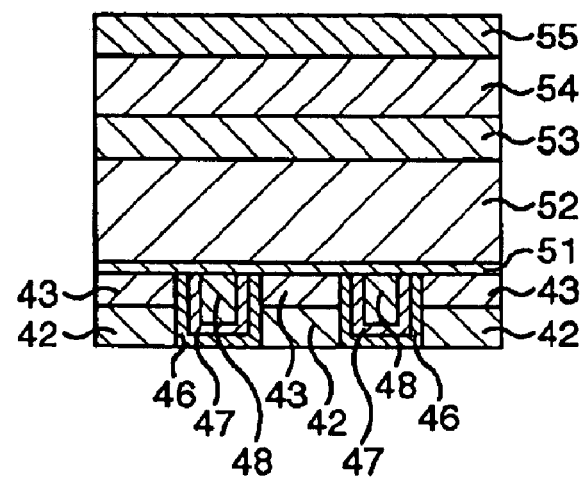

Subsequently, as shown in FIG. 20B, an organic low dielectric film based on aryl ether (film thickness: 150 nm) to be used as a second insulating film 53 in which a wiring portion will be formed, and a SiO₂ film 54 (film thickness: 250 nm) are formed sequentially on the first insulating film 52. Further, a SiN film 55 (film thickness: 100 nm) (or SiC film) to be used as an etching mask when forming the wiring portion is formed on the SiO₂ film 54 through a plasma CVD method.

In this embodiment, based on the discussion in the second embodiment above, the first insulating film 52 for the plug portion and the second insulating film 54 for the wiring portion are formed under control so that a ratio of the film stress of the second insulating film 54 to the film stress of the first insulating film 52 will be 1.58 or less.

As to the first insulating film 52 for the plug portion, as long as the film stress is the same as the film stress of the wiring portion, gas used for film formation can be any of TEOS/O₂, TEOS/O₃, and SiH₄/N₂O/N₂. Also, SiOF, PSG, or BPSG can be suitably used instead of SiO₂ as the material thereof.

In regard to the second insulating film 53 for the wiring portion, the organic low dielectric film based on aryl ether may be replaced with one of a SiOF film, a low dielectric film based on fluorocarbon, a low dielectric film based on hydrogen silsesquioxane, a low dielectric film based on hydromethyl silsesquioxane, a low dielectric film based on porous quioxane, an organosilicate glass film, and a low dielectric film based on porous aryl ether.

Figure 21A:
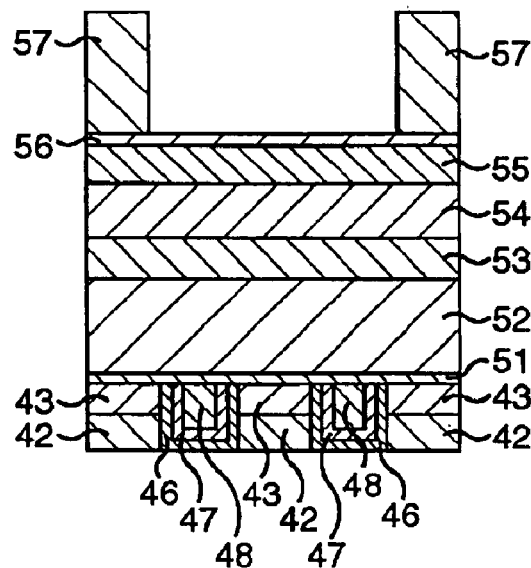
FIGS. 21A and 21B are schematic sectional views subsequent to FIG. 20B, showing a fabrication sequence in the method of forming the hybrid wiring structure of the third embodiment.

Subsequently, as shown in FIG. 21A, after an anti-reflection film 56 is formed on the SiN film 55, photoresist is applied on the anti-reflection film 56, and made into a resist pattern 57 in the shape of a wiring groove through photolithography.

Figure 21B:
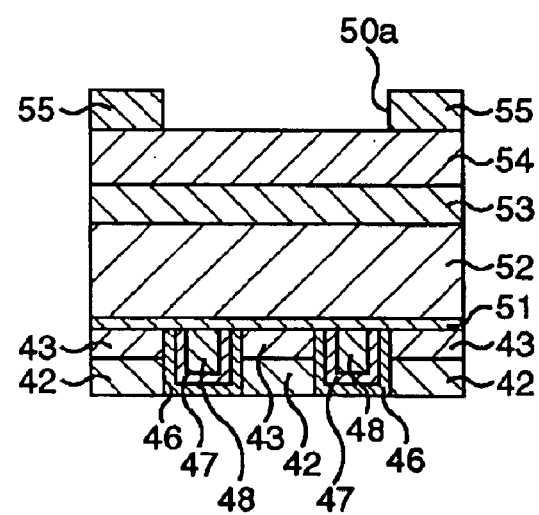

Subsequently, as shown in FIG. 21B, the anti-reflection film 56 and the SiN film 55 are subjected to plasma etching using the resist pattern 57 as a mask, and a first wiring groove 50a is thereby formed in the SiN film 55. Afterwards, unwanted resist pattern 57 and anti-reflection film 56 are removed.

Figure 22A:
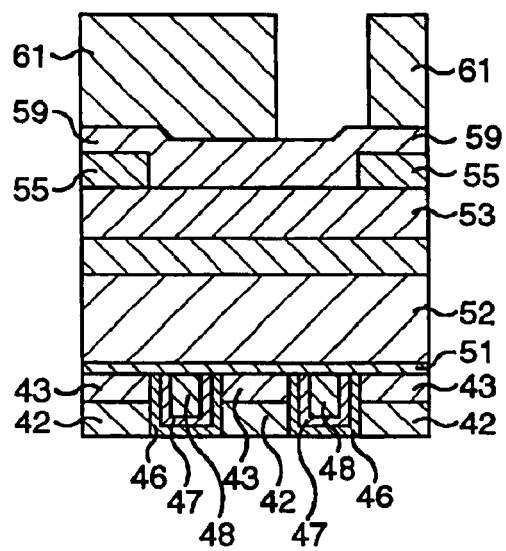
FIGS. 22A through 22C are schematic sectional views subsequent to FIG. 21B, showing a fabrication sequence in the method of forming the hybrid wiring structure of the third embodiment.

Subsequently, as shown in FIG. 22A, after an anti-reflection film 59 (film thickness: 140 nm) is formed on the SiN film 55 so as to fill up the first wiring groove 50a, photoresist is applied on the reflection preventing film 59, and made into a resist pattern 61 in the shape of a via hole through photolithography.

Figure 22B:
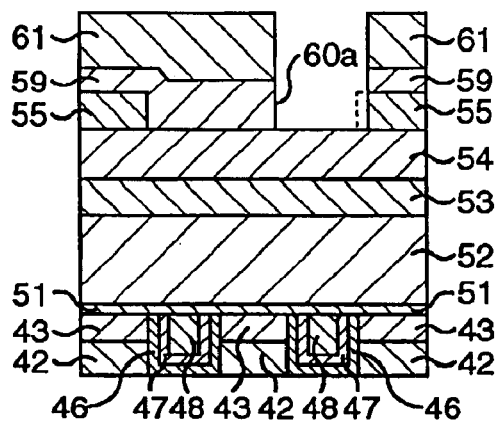

Subsequently, as shown in FIG. 22B, the anti-reflection film 59 and the SiN film 55 are subjected to plasma etching using the resist pattern 61 as a mask, and a first via hole 60a is thereby made in the anti-reflection film 59.

Figure 22C:
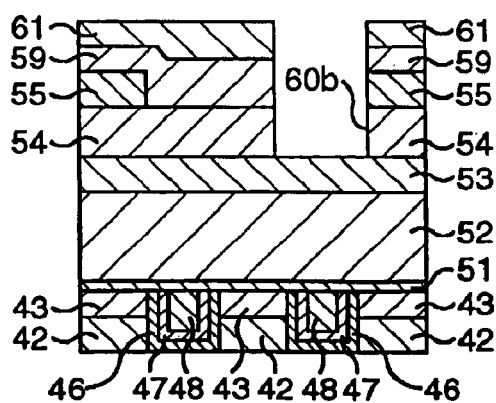

Subsequently, as shown in FIG. 22C, the SiO₂ film 54 is subjected to etching using the second insulating film 53 as a stopper, and a second via hole 60b continuing from the first via hole 60a is thereby made in the SiO₂ film 54.

Figure 23A:
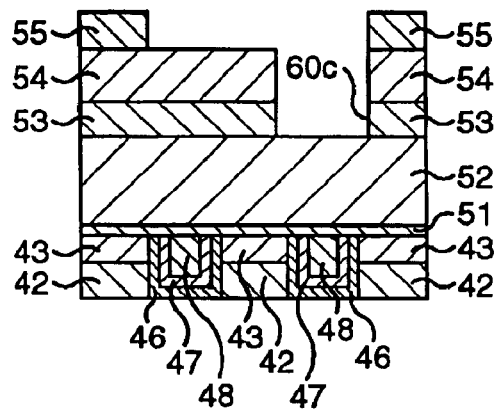
FIGS. 23A through 23C are schematic sectional views subsequent to FIG. 22C, showing a fabrication sequence in the method of forming the hybrid wiring structure of the third embodiment.

Further, as shown in FIG. 23A, the second insulating film 53 is subjected to etching using the first insulating film 52 as a stopper, and a third via hole 60c continuing from the second via hole 60b is thereby made in the second insulating film 53. In this instance, the resist pattern 61 and the anti-reflection film 59 are etched away.

Figure 23B:
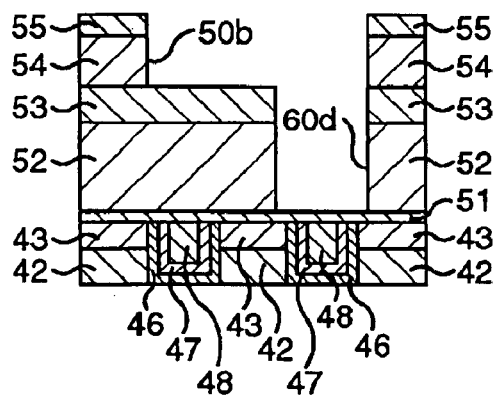

Subsequently, as shown in FIG. 23B, the first insulating film 52 is subjected to etching using the SiN film 51 as a stopper, and a fourth via hole 60d continuing from the third via hole 60c is thereby made in the first insulating film 52. Meanwhile, the SiO₂ film 54 is subjected to etching using the SiN film 55 in which the first wiring groove 50a has been formed, as a mask and the second insulating film 53 as a stopper, and a second wiring groove 50*b* continuing from the first wiring groove 50*a* is thereby made in the SiO$_2$ film 54.

Figure 23C:
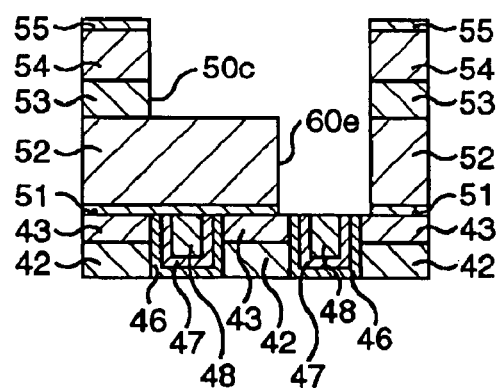

Subsequently, as shown in FIG. 23C, the SiN film 51 is subjected to etching so that the surface of the wiring 49 is exposed, and a fifth via hole 60*e* continuing from the fourth via hole 60*d* is thereby made in the SiN film 51. Meanwhile, the second insulating film 53 is subjected to etching using the first insulating film 52 as a stopper, and a third wiring groove 50*c* continuing from the second wiring groove 50*b* is thereby made in the second insulating film 53.

Figure 24A:
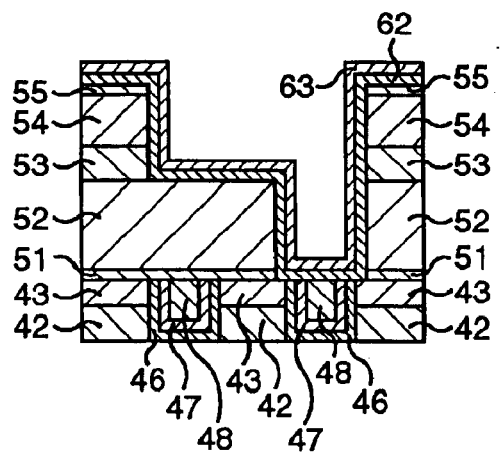
FIGS. 24A through 24C are schematic sectional views subsequent to FIG. 23C, showing a fabrication sequence in the method of forming the hybrid wiring structure of the third embodiment.

Subsequently, as shown in FIG. 24A, a Ta film (film thickness: 15 nm) to be used as a barrier metal film 62 is formed through a sputtering method so as to cover the inner wall surfaces of the wiring grooves 50*a* through 50*c* and the via holes 60*a* through 60*e*. Then, a plated electrode film 63 (film thickness: 130 nm) is formed on the barrier metal film 62.

Figure 24B:
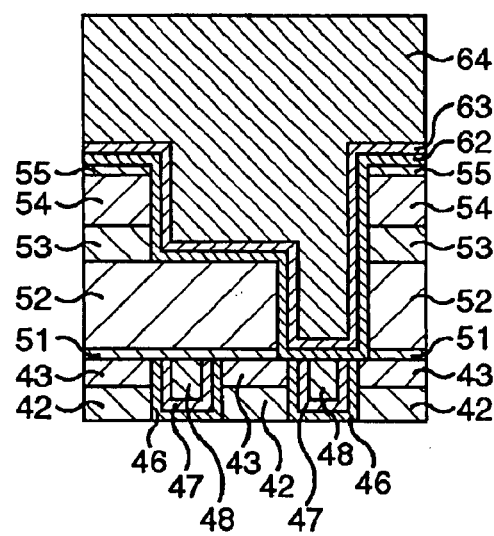
Figure 24C:
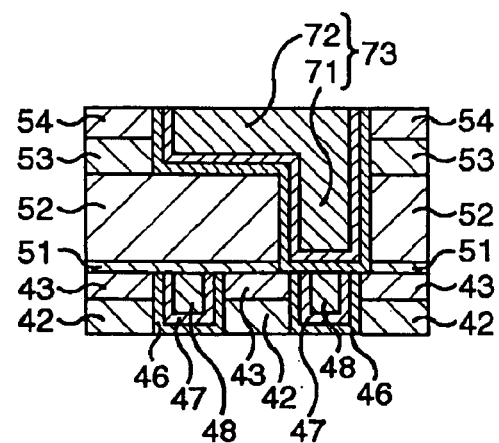

Subsequently, as shown in FIG. 24B, after a Cu film 64 is formed through an electrical plating method until the film thickness reaches 970 nm, as shown in FIG. 24C, the Cu film 64 and the barrier metal film 63 are polished through a CMP method. In this instance, a plug portion 71 filling up the via holes 60*a* through 60*e* and a wiring portion 72 filling up the wiring grooves 50*a* through 50*c* are formed integrally, and a hybrid wiring structure 73 is thus obtained.

Figure 25:
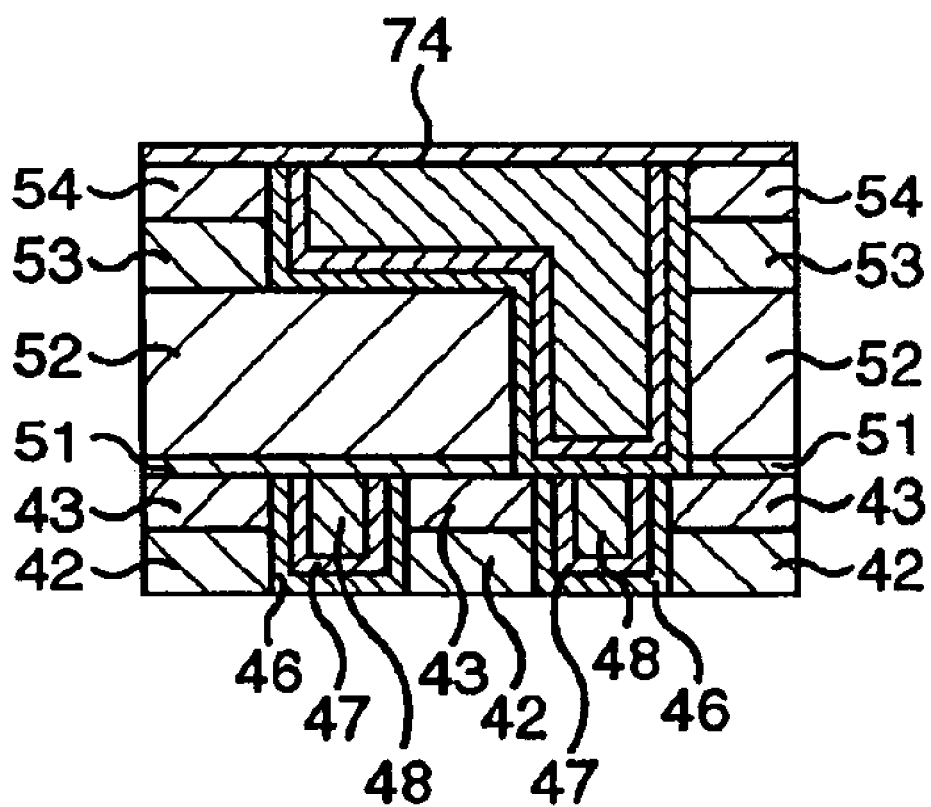
FIG. 25 is a schematic sectional view subsequent to FIG. 24C, showing a fabrication sequence in the method of forming the hybrid wiring structure of the third embodiment.

Afterwards, as shown in FIG. 25, a SiN film (film thickness: 70 nm) to be used as a cover film 74 is formed on the hybrid wiring structure 73 thus obtained.

A stress migration test was conducted using the hybrid wiring structure of this embodiment, and a favorable result was obtained that the lifetime of the wiring was increased about four times longer than that of the conventional one.

As has been described, according to this embodiment, by controlling the film stress of the second insulating film 54 in which the wiring portion 72 is formed and the film stress of the first insulating film 52 in which the plug portion 71 is formed so as to reduce a difference in stress between the wiring portion 72 and the plug portion 71, there can be achieved a hybrid wiring structure having extremely high wiring reliability, which can not only maintain sufficient mechanical strength, but also improve the stress migration characteristic markedly while suppressing crosstalks between the wiring on the upper layer and the wiring on the lower layer.

According to the invention, there can be achieved a wiring structure having extremely high wiring reliability, which is formed based on a universal judgment reference established for the wiring structure independently of the forms, such as a structure and a material of an insulating film in which the wiring structure is formed, and can thus not only maintain sufficient mechanical strength, but also improve a stress migration characteristic remarkably even when a low dielectric material is used in part of the insulating film.

What is claimed is:

1. A wiring structure comprising:
   a wiring portion overlaid to extend above a substrate; and
   a plug portion formed integrally with said wiring portion,
   wherein a difference between deviation stress applied to said wiring portion in a longitudinal direction and deviation stress applied to said plug portion in a direction perpendicular to a central axis of said plug portion is 220 MPa or less at a room temperature.

2. The wiring structure according to claim 1, wherein said plug portion is formed so as to fill up an opening made in a first insulating film, and said wiring portion is formed so as to fill up a wiring groove made at least in a second insulating film.

3. The wiring structure according to claim 2, wherein each of said wiring portion and said plug portion, which are formed integrally, is made of a metal material containing copper.

4. The wiring structure according to claim 2, wherein said wiring portion is formed so as to fill up a wiring groove made in said second insulating film and in a third insulating film different in dielectric constant from said second insulating film.

5. The wiring structure according to claim 2, wherein said first insulating film is an oxide film and said second insulating film is an organic low dielectric film.

6. The wiring structure according to claim 3, wherein said first insulating film is an oxide film and said second insulating film is an organic low dielectric film.

7. The wiring structure according to claim 2, wherein said second insulating film is one selected from the group consisting of a SiOF film, an organic low dielectric film based on aryl ether, a low dielectric film based on fluorocarbon, a low dielectric film based on hydrogen silsesquioxane, a low dielectric film based on hydromethyl silsesquioxane, a low dielectric film based on porous quioxane, and a low dielectric film based on porous aryl ether.

8. The wiring structure according to claim 3, wherein said second insulating film is one selected from the group consisting of a SiOF film, an organic low dielectric film based on aryl ether, a low dielectric film based on fluorocarbon, a low dielectric film based on hydrogen silsesquioxane, a low dielectric film based on hydromethyl silsesquioxane, a low dielectric film based on porous quioxane, and a low dielectric film based on porous aryl ether.

* * * * *